United States Patent
Nakao

Patent Number: 5,751,186
Date of Patent: May 12, 1998

[54] OPERATIONAL AMPLIFIER CIRCUIT WITH AN EXTENDED INPUT VOLTAGE RANGE

[75] Inventor: Tomoaki Nakao, Yamatokoriyama, Japan

[73] Assignee: Sharp Kabushiki Kaisha, Osaka, Japan

[21] Appl. No.: 659,585

[22] Filed: Jun. 6, 1996

[30] Foreign Application Priority Data

Nov. 2, 1995 [JP] Japan ................... 7-286112

[51] Int. Cl.⁶ .......................... H03F 3/45; H03K 17/687
[52] U.S. Cl. ..................... 327/562; 327/65; 330/253; 330/255
[58] Field of Search ................... 327/560, 561, 327/562, 563, 52, 53, 65, 66, 67, 72, 80; 330/252, 253, 254, 255, 257, 261, 262, 263, 269, 288

[56] References Cited

U.S. PATENT DOCUMENTS

| | | | |
|---|---|---|---|
| 4,377,789 | 3/1983 | Hoover | 330/253 |
| 4,736,117 | 4/1988 | Wieser | 327/560 |
| 4,987,379 | 1/1991 | Hughes | 330/253 |
| 5,142,244 | 8/1992 | Glica et al. | 330/253 |
| 5,166,635 | 11/1992 | Shih | 330/255 |
| 5,189,318 | 2/1993 | Tanaka | 327/80 |
| 5,285,168 | 2/1994 | Tomatsu et al. | 330/255 |
| 5,574,401 | 11/1996 | Spitalny | 330/253 |

FOREIGN PATENT DOCUMENTS 292008  3/1990  Japan ................... H03F 3/45

Primary Examiner—Timothy P. Callahan
Assistant Examiner—Terry L. Englund

[57] ABSTRACT

An operational amplifier circuit 21 comprises transistors N14, N15 in a first output amplifier circuit 24, and transistors P24, P25 in a second output amplifier circuit 25. When a second differential amplifier circuit 23 is cut off, the output is driven by transistor P13 and transistors N14, N15. When a first differential amplifier circuit 22 is cut off, the output is driven by transistor N23 and transistors P24, P25. Therefore, if such a voltage as to cut off one differential amplifier circuit is given from opposite phase and in-phase input terminals 31, 32, the output can be produced. In such constitution, without using depletion type transistors that require particular manufacturing process, the range of the voltage that can be entered in the input terminal can be extended.

18 Claims, 7 Drawing Sheets

OPERATIONAL AMPLIFIER CIRCUIT WITH AN EXTENDED INPUT VOLTAGE RANGE

BACKGROUND OF THE INVENTION

1. Field of the Invention

The present invention relates to an operational amplifier circuit composed of CMOS (complementary metal oxide semiconductor).

2. Description of the Related Art

FIG. 6 is a circuit diagram of a CMOS operational amplifier circuit 1 disclosed in Japanese Unexamined Patent Publication JP-A 2-92008 (1990) as a typical prior art. The operational amplifier circuit 1 comprises an opposite phase input terminal 2, an in-phase input terminal 3, an output terminal 4, a first bias input terminal 5, and a second bias input terminal 6, and consists of a first differential amplifier circuit 11, a second differential amplifier 12, and an output amplifier circuit 13.

The first differential amplifier circuit 11 is composed of n-channel MOS transistors (hereinafter called transistors for short) Mn1, Mn2, Mn3, and p-channel MOS transistors (hereinafter transistors) Mp1, Mp2. The second differential amplifier circuit 12 is composed of n-channel MOS transistors Mn4, Mn5, and p-channel MOS transistors Mp4, Mp5, Mp6. The output amplifier circuit 13 is composed of a p-channel MOS transistor Mp3 to the gate of which is supplied an output (a) of the first differential amplifier 11, and an n-channel MOS transistor Mn6 to the gate of which is supplied an output (b) of the second differential amplifier circuit 12.

In the first differential amplifier circuit 11, the sources of a pair of n-channel MOS transistors Mn2, Mn3 for differential amplification are connected to each other. The gate of the transistor Mn2 is connected to the opposite phase input terminal 2, and a voltage V1 is supplied. The gate of the transistor Mn3 is connected to the in-phase input terminal 3, and a voltage V2 is supplied.

The transistors Mp1, Mp2 are active loads of the transistors Mn2, Mn3, and a voltage VDD is supplied to each source. A drain potential of the transistor Mn2 is supplied to the gate of the transistors Mp1, Mp2, and control of conduction and cutoff is carried out. The drain potential of the transistor Mn2 is a signal for controlling the output (a) to the output amplifier circuit 13.

The transistor Mn1 is a constant current source for giving a proper bias current to the transistors Mn2, Mn3, to the source of which a voltage VSS is supplied and the drain of which is connected to the sources of the transistors Mn2, Mn3. By a bias voltage VB1 from a first bias input terminal 5 given to the gate, the bias current to be supplied to the transistors Mn2, Mn3 is determined. By the output (a) of the first differential amplifier circuit 11, the output transistor Mp 3 is driven.

The second differential amplifier 12 is similar to the first differential amplifier 11, except that the conductive type of the transistors is exchanged, and therefore only different points from the first differential amplifier circuit 11 are described. The transistors Mn1, Mn2, Mn3, Mp1, Mp2 are replaced respectively and sequentially with the transistors Mp4, Mp5, Mp6, Mn4, Mn5.

The gate of the transistor Mp5 is connected to the opposite phase input terminal 2 commonly with the transistor Mn2, and the gate of the transistor Mp6 is connected to the in-phase input terminal 3 commonly with the transistor Mn3. Voltage VSS is supplied to the sources of the transistors Mn4, Mn5. To the gates of the transistors Mn4, Mn5, the drain potential of the transistor Mp5 is given, and control of conduction and cutoff is carried out. The drain potential of the transistor Mp5 is a signal for controlling the output (b) to the output amplifier circuit 13. The gate of the transistor Mp4 is connected to a second bias terminal 6, and a bias voltage VB2 is given. Voltage VDD is supplied to the source of the transistor Mp4, and the drain is connected to the sources of the transistors Mp5, Mp6.

In the output amplifier circuit 13, the output (a) is given to the gate of the transistor Mp3, and voltage VDD is given to the source of the transistor Mp3. To gate of the transistor Mn6 is supplied the output (b), and voltage VSS is given to the source of the transistor Mn6. The drains of the transistors Mp3, Mn6 are connected to the output terminal 4, and an output voltage V0 is delivered according to the outputs (a), (b).

In thus constituted operational amplifier circuit 1, the operation is described below. FIG. 7 is a diagram for explaining the operation of the operational amplifier circuit 1. The axis of abscissas denotes voltage V2 which is an in-phase input to be fed into the in-phase input terminal 3, and the axis of ordinates represents voltage V1 which is an opposite phase input to be fed into the opposite phase input terminal 2.

When the voltage fed in the in-phase input terminal 3 becomes higher than the voltage fed to the opposite phase input terminal 2, the current flowing in the transistor Mn3 in the first differential amplifier circuit 11 increases, and the drain potential of the transistor Mp2 is lowered, and therefore the transistor Mp3 conducts and the potential of the output terminal 4 is pulled down. At the same time, the current flowing in the transistor Mp6 of the second differential amplifier 12 decreases, and the drain potential of the transistor Mn5 is lowered, so that the transistor Mn6 is cut off. Therefore, the output voltage V0 of the output terminal 4 elevates to the voltage VDD side.

When the voltage fed to the in-phase input terminal 3 becomes lower than the voltage fed to the opposite phase input terminal 2, the current flowing in the transistor Mp6 of the second differential amplifier 12 increases, and the drain potential of the transistor Mn5 climbs up, and the transistor Mn6 conducts. At the same time, the current flowing in the transistor Mn3 decreases, and the drain potential of the transistor Mp2 rises to cut off the transistor Mp3. Therefore, the output voltage V0 of the output terminal 4 descends to the voltage VSS side.

As stated above, the output from the output terminal 4 of the operational amplifier circuit 1 is outputted in the push-pull format by the transistors Mp3, Mn6. The transistors Mp3, Mn6 are both source-grounded, and their gate signals have a sufficient amplitude, and therefore driving of a wide output dynamic range and a large load is expected in the constitution.

Each transistor for composing the operational amplifier circuit 1 is generally an enhancement type transistor. In the enhancement type transistor, since channel region is not formed at the time of manufacture, in the case of an n-channel transistor, for example, a drain current flows only when a positive voltage is applied to the gate. Contrary to the enhancement type transistor, in the depletion type transistor, since a channel region is formed between the source and drain in manufacturing, a drain current flows also when a negative voltage is applied to the gate.

Supposing the transistors Mn2, Mn3 are enhancement type transistors, having a positive threshold voltage Vtn, when the voltages V1, V2 supplied from the respective input terminals 2, 3 becomes lower than the voltage VSS+Vtn, the transistors Mn2, Mn3 are cut off, and current does not flow in the first differential amplifier circuit 11, so that the voltage applied to the gate of the transistor Mp3 is raised up to the voltage VDD. When the transistor Mp3 is an enhancement type transistor, it is cut off, and the output voltage V0 cannot be driven to the higher potential side. Likewise, supposing the transistors Mp5, Mp6 to be enhancement type transistors, having a negative threshold voltage Vtp, when the input voltage is higher than the voltage VDD—|Vtp |, no current flows in the second differential amplifier circuit 12, and the voltage applied to the gate of the transistor Mn6 descends to the voltage VSS. When the transistor Mn6 is an enhancement type transistor, it is cut off, and the output voltage V0 cannot be driven to the lower potential side.

Thus constituted operational amplifier circuit 1 can operate normally only when the voltage put into the opposite phase and in-phase input terminals 2, 3 is in a range from the voltage VSS+Vtn to the voltage VDD—|Vtp |, and the allowable input voltage range is limited.

By composing the transistors of the operational amplifier circuit 1 by using the depletion type transistors, the working voltage range can be extended to voltage VSS to VDD, but the manufacturing process of depletion type transistor requires a special manufacturing process for forming the channel region as mentioned above, as compared with the manufacturing process of the enhancement type transistors, and hence the manufacturing cost is increased.

SUMMARY OF THE INVENTION

It is hence a primary object of the invention to provide an operational amplifier circuit capable of extending the range of voltage that can be entered in an input terminal, without using a depletion type transistor that requires a particular manufacturing process.

To achieve the object, the invention provides an operational amplifier comprising:

first and second input terminals for receiving respective input signals, first differential amplifying means composed of a pair of n-channel type field effect transistors for providing differential amplification, to the gate of one of which the first input terminal is connected, and to the gate of the other of which the second input terminal is connected, second differential amplifying means composed of a pair of p-channel type field effect transistors for differential amplification, to the gate of one of which the first input terminal is connected, and to the gate of the other of which the second input terminal is connected, output amplifying means including a first p-channel type field effect output transistor, to the gate of which is inputted an output of the first differential amplifying means, to the source of which is supplied a predetermined first potential, and to the drain of which is supplied a predetermined second potential so as to be lower than the predetermined first potential through a first load element, and a second n-channel type field effect output transistor, to the gate of which is inputted an output of the second differential amplifying means, to the source of which is supplied is supplied the predetermined second potential, to the drain of which the predetermined first potential through a second load element, and an output terminal for providing an output signal commonly connected to the drain of the first field effect output transistor, and the drain of the second field effect output transistor.

According to the invention, each differential amplifying means controls conduction and cutoff of each corresponding field effect output transistor, on the basis of the signal commonly fed from two input terminals. While the conductive state of the first and second field effect output transistors is controlled by the input signal, the output is produced in push-pull format by the two field effect output transistors. When either one of the differential amplifying means goes into a cutoff state i.e. becomes non conductive, the output is produced by forming a passage of current by the field effect output transistor corresponding to the other differential amplifying means and the corresponding load element. Therefore, if such an output is supplied so as to cut off the output of one differential amplifier means, the current passage is formed so that the output is produced.

In the invention, the output amplifying means is provided with:

a first switching element interposed between the first load element and the predetermined second potential, or between the first load element and the first field effect output transistor, so as to be cut off when the first differential amplifying means goes into a cutoff state, and a second switching element interposed between the second load element and the predetermined first potential, or between the second load element and the second field effect output transistor, so as to be cut off when the second differential amplifying means goes into a cutoff state.

According to the invention, when the first differential amplifying means goes into a cutoff state, the first switching element provided between the first load element and the predetermined second potential, or between the first load element and the first field effect output transistor is cut off. When the second differential amplifying means goes into cutoff state, the second switching element provided between the second load element and the first potential, or between the second load element and the second field effect output transistor is cut off. Therefore, the current is prevented from flowing through the load element corresponding to the differential amplifying means in the cutoff state.

In the invention, the first and second load elements form loads having a specific resistance value when the corresponding differential amplifying means is in a conductive state, and cuts off the current flow when the corresponding differential amplifying means is in a cutoff state.

According to the invention, when the differential amplifying means is in a cutoff state, the current flowing in the first and second load elements is cut off, and when the differential amplifying means is in a conductive state, the first and second load elements act as the loads having a specific resistance value. To the first and second load elements is supplied a bias voltage for producing a specific operating point, for example, to the field effect transistor of the differential amplifying means, commonly with the corresponding differential amplifying means, and it is determined whether each load element passes current on the basis of the bias voltage. Therefore, depending on the supplied voltage, each load either cuts off the current flow, or forms a load of having a specific resistance value, and hence a switching element for controlling the current flow is not required, and the area for forming the operational amplifier circuit can be made smaller.

In the invention, control of conduction and cutoff of the first switching element is carried out by the source potential of the field effect transistor in the first differential amplifying means, and control of conduction and cutoff of the second switching element is carried out by the source potential of the field effect transistor in the second differential amplifying means.

According to the invention, the source potential of the field effect transistors for differential amplification of the first differential amplifying means is supplied to the gate of the first switching element, and the source potential of the field effect transistors for differential amplification of the second differential amplifying means is supplied to the gate of the second switching element. Therefore, control of conduction and cutoff of each switching element is carried out by the potential applied to the field effect transistor in each differential amplifying means, and it is not necessary to feed another signal for this control, so that an increase of input terminals in number is prevented.

In the invention, a bias voltage for producing a specific operating point to the pair of field effect transistors for differential amplification is respectively supplied to the first and second differential amplifying means, the first load element is a transistor which is made to conduct by the bias voltage supplied to the first differential amplifying means, and the second load element is a transistor which is made to conduct by the bias voltage supplied to the second differential amplifying means.

According to the invention, the first load element provided between the first switching element and second potential is a transistor which is made to conduct by the bias voltage supplied to the first differential amplifying means. The second load element provided between the second switching element and first potential is a transistor which is made to conduct by the bias voltage supplied to the second differential amplifying means. Therefore, as compared with the case of using merely resistances as the load elements, the area normally necessary for forming the operational amplifier circuit can be reduced.

It is a feature of the invention to operate the output from the output terminal as a voltage follower by supplying the output to either one of the two input terminals.

According to the invention, in each differential amplifying means of the operational amplifier circuit, two input terminals are connected, and signals are fed. When the output signal from the output terminal is fed into either one of the two input terminals, the output signal operates as a voltage follower. Therefore, fluctuations of output signal due to effects of variations of input terminal side signal or the like can be prevented, and the dynamic range of the input voltage can be extended.

Thus, according to the invention, if either output transistor is cut off by the voltage of the signal coupled from the input terminal, the current flows between the other field effect output transistor and the load element for this field effect transistor, and hence the output can be produced if such a voltage so as to cut off the one differential amplifying means is coupled as the voltage of the signal applied to the input terminal, the dynamic range of the signal given to the input terminal is extended.

Also according to the invention, since the switching element to be cut off when the corresponding differential amplifying means goes into a cutoff state is provided between each load element and each field effect output transistor, or between each load element and the potential to which each load element is connected, if one differential amplifying means is cut off and the output signal is produced by the output transistor corresponding to the other differential amplifying means and the load element, extra current does not flow, and the current consumed in the operational amplifier circuit can be made low.

Further according to the invention, each load element either cuts off the current flow or becomes a load having a specific resistance value, depending on whether the first and second differential amplifying means is conducting or is cut off, and therefore it is not necessary to have a switching element and a load element independently for controlling the current flow, and the area required for forming the operational amplifier circuit can be made relatively small.

Also according to the invention, control of the conduction or cutoff of each corresponding switching element is carried out by the voltage of the signal applied as a source potential of the field effect transistor in each differential amplifying means, and therefore it is not necessary to feed another signal for this control, and an increase in the number of input terminals is thereby prevented, while the area for forming the operational amplifier circuit is kept small.

Also according to the invention, since the first and second load elements, which are transistors, are made to conduct by the bias voltage supplied to each corresponding differential amplifying means, the area necessary for forming the operational amplifier circuit is smaller than in the case of providing merely resistances as load elements.

Also according to the invention, two input terminals are connected to each differential amplifying means and the output signal from the output terminal is fed to either input terminal, and thereby the operational amplifier circuits works as voltage follower, so that fluctuations of output signal due to effects of variations of input terminal side signal or the like can be prevented, while the dynamic range of input voltage may be extended.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
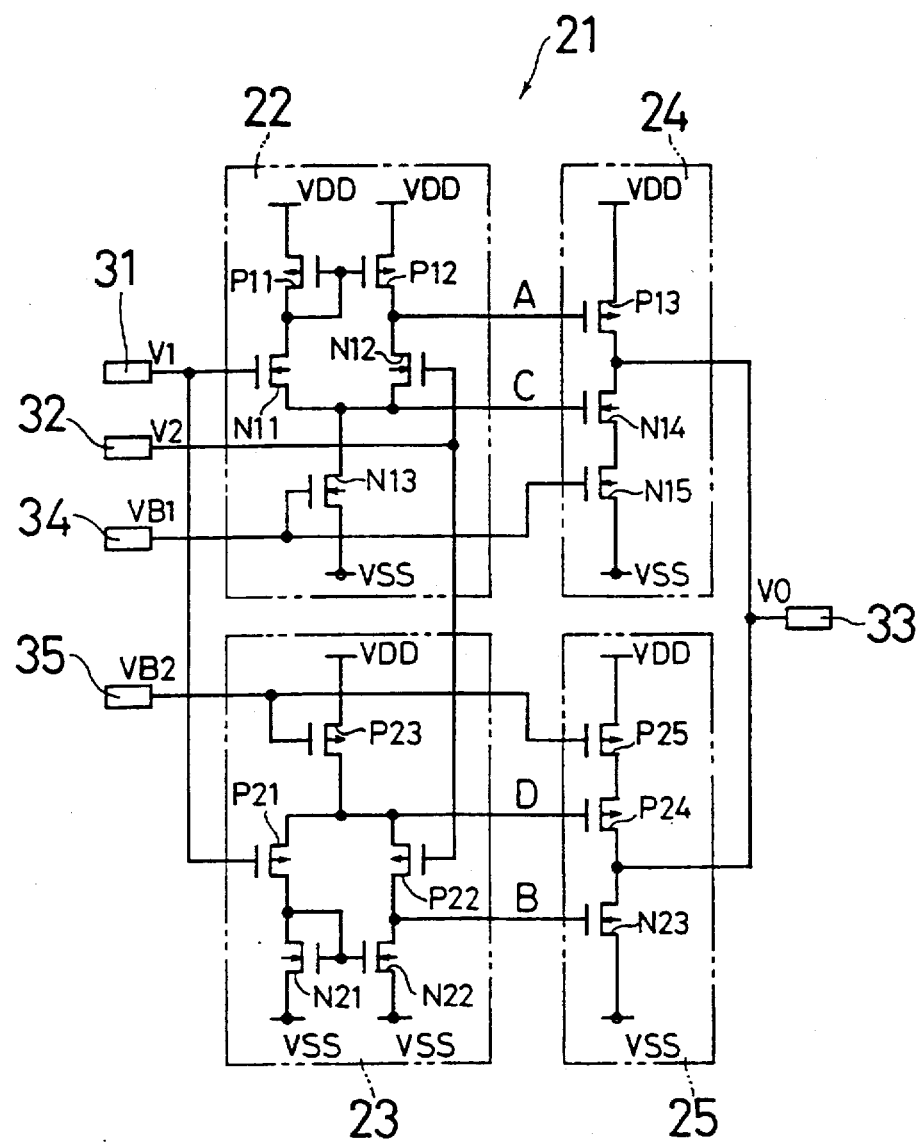
FIG. 1 is a circuit diagram of an operational amplifier circuit 21 of a first embodiment of the invention.

Now referring to the drawings, preferred embodiments of the invention are described below.

FIG. 1 is a circuit diagram of an operational amplifier circuit 21 of a first embodiment of the invention. The operational amplifier circuit 21 comprises a first differential amplifier circuit 22, a second differential amplifier circuit 23, a first output amplifier circuit 24, and a second output amplifier circuit 25.

The first differential amplifier circuit 22 comprises n-channel MOS transistors N11, N12, N13, and p-channel MOS transistors P11, P12. The transistors N11, N12 of the first differential amplifier circuit 22 are formed as a pair of transistors for differential amplification, and the sources of the transistors are connected to each other. To the gate of the transistor N11, a voltage V1 is fed from an opposite phase input terminal 31, and to the gate of the transistor N12, a voltage V2 is fed from an in-phase input terminal 32. The drain of the transistor N11 is connected to the drain and gate of the transistor P11 to the source of which is supplied a voltage VDD. The drain of the transistor N12 is connected to the drain of the transistor P12 to the source of which is supplied a voltage VDD. The gates of the transistors P11, P12 are connected to each other. The drain signal of the transistor N11 controls the output A of the first differential amplifier 22. The output A is given to the first output amplifier circuit 24.

The gate of the transistor N13 is connected to the first bias input terminal 34, and a bias voltage VB1 is given. A voltage VSS is supplied to the source of the transistor N13, and the drain is connected to the sources of the transistors N11, N12 commonly connected in the first differential amplifier circuit 22.

The second differential amplifier circuit 23 comprises n-channel MOS transistors N21, N22, and p-channel MOS transistors P21, P22, P23. The structure of the second differential amplifier circuit 23 is similar to the first differential amplifier 22, except that the conductive types of the transistors are exchanged, and only the different points from the first differential amplifier circuit 22 are described.

In the second differential amplifier circuit 23, the transistors N11, N12, N13, P11, P12 of the first differential amplifier circuit 22 are replaced respectively and sequentially with the transistors P21, P22, P23, N21, N22. The voltage VDD is supplied to the source of the transistor P23, and the gate of the transistor P23 is connected to a second bias input terminal 35. The voltage VSS is given to the sources of the transistors N21, N22. The drain signal of the transistor P21 controls an output B of the second differential amplifier circuit 23. The output B is fed to the second output amplifier circuit 25.

The first output amplifier circuit 24 comprises n-channel MOS transistors N14, N15, and p-channel MOS transistor P13. The voltage VDD is given to the source of the transistor P13. The drain of the transistor P13 is connected to the drain of the transistor N14, and the drain voltage is given to an output terminal 33 as the output of the first output amplifier circuit 24. Control of conduction and cutoff of the transistor P13 is carried out by the output A of the first differential amplifier 22 given to the gate.

The transistor N15 composes a bias circuit for forming a current passage between the output terminal 33 and voltage VSS, and is connected to the output terminal 33 through the transistor N14 to the source of which is supplied the voltage VSS, and drain is a switching element. To the gate of the transistor N15, same as in the transistor N13, the bias voltage VB1 is given from the first bias input terminal 34.

The transistor N14, to the gate of which is supplied an output C of the transistor N13, works as a switching element. The transistor N14 cuts off the current passed by the transistor N15 when the output voltage of the transistor N13 becomes low and the first differential amplifier circuit 22 is cut off.

The second output amplifier circuit 25 comprises an n-channel MOS transistor N23, and p-channel MOS transistors P24, P25. The voltage VSS is supplied to the source of the transistor N23. The drain of the transistor N23 is connected to the drain of the transistor P24, and the drain voltage is given to the output terminal 33 as the output of the second output amplifier circuit 25. Conduction and cutoff of the transistor N23 is controlled by the output B of the second differential amplifier circuit 23 given to the gate.

The transistor P25 composes a bias circuit forming a current passage between the voltage VDD and output terminal 33, and the voltage VDD is supplied to the source thereof, and the drain thereof is connected to the output terminal 33 through the transistor P24 which is a switching element. To the gate of the transistor P25, a bias voltage VB2 is given from the second bias input terminal 35 same as in the case of transistor P23. To the gate of the transistor P24 is supplied an output D of the transistor P23, and the transistor P24 acts as a switching element. The transistor P24 cuts off the current passed by the transistor P25 when the output voltage of the transistor P23 is high and the second differential amplifier circuit 23 is cut off.

Figure 2:
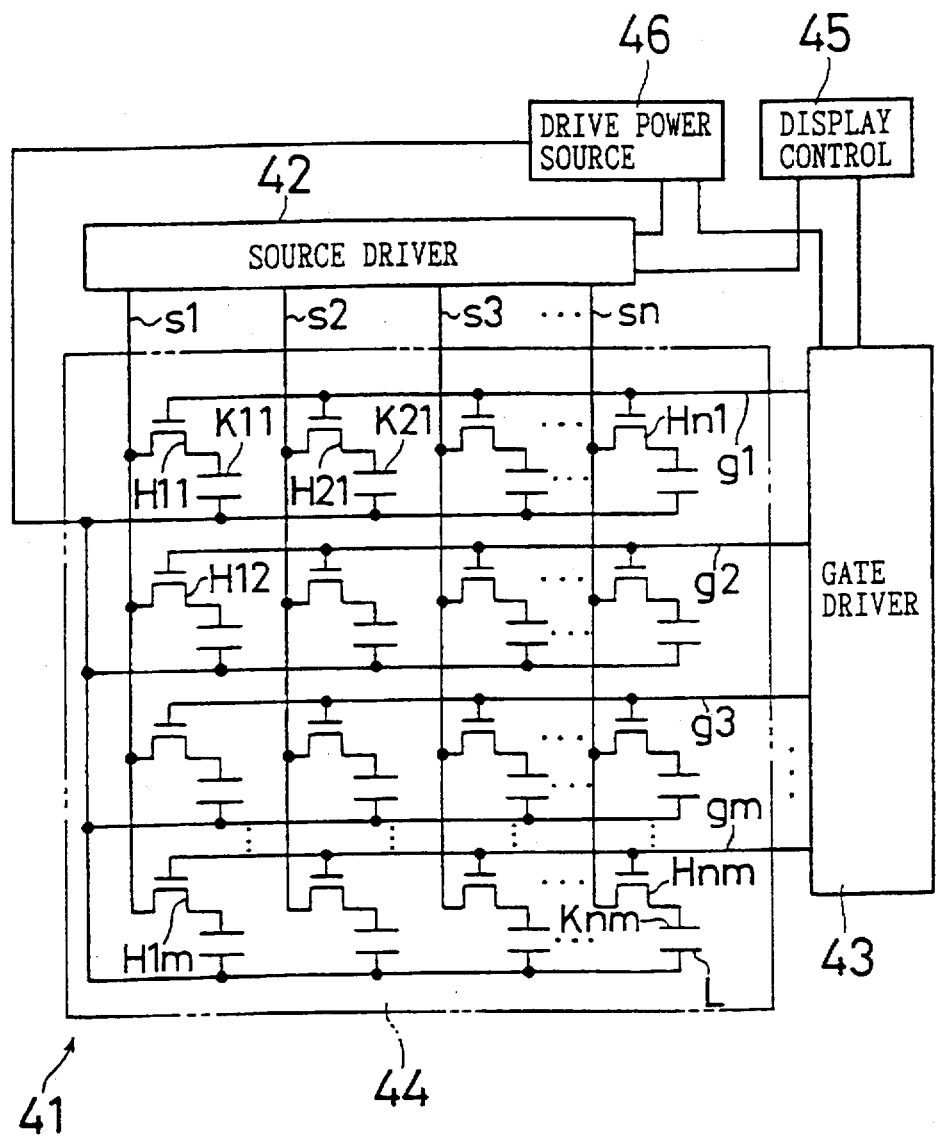
FIG. 2 is a block diagram showing the constitution of a TFT type liquid crystal display device 41.
Figure 3:
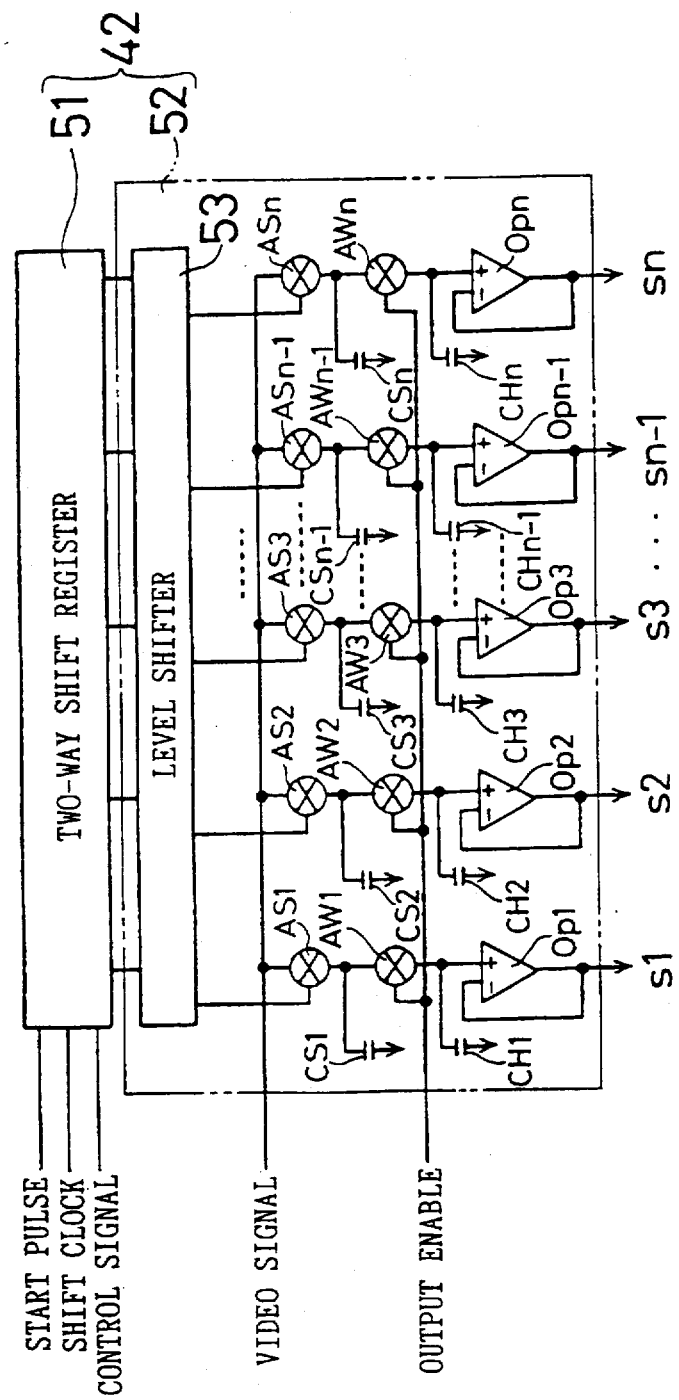
FIG. 3 is a block diagram showing the constitution of a source driver 42 in the liquid crystal display device 41.

FIG. 2 is a block diagram showing the constitution of a liquid crystal display device 41 of TFT (thin film transistor) type in which thus constituted operational amplifier circuit 21 is used, and FIG. 3 is a block diagram showing the constitution of a source driver 42 in the liquid crystal display device 41.

The liquid crystal display device 41 comprises the source driver 42, a gate driver 43, a liquid crystal display panel 44, a display control circuit 45, and a drive power source circuit 46.

In the liquid crystal display panel 44, source electrodes s1 to sn (collectively indicated by reference code s) and gate electrodes g1 to gm (collectively indicated by reference code g) are disposed orthogonally. Near the intersecting points of the electrodes, thin film transistors Hij (i being 1 or more and n or less, j being 1 or more and m or less) are provided, and the gates of the thin film transistors Hij on a same horizontal line are connected to a same gate electrode g, and are sequentially scanned by a gate driver 43. The sources of the thin film transistors Hij on a same vertical line are connected to a same source electrode s, and the voltage depending on the gradation to be displayed is supplied to the thin film transistors Hij by the source driver 42.

The drains of the thin film transistors Hij are connected to pixel electrodes Kij. Each pixel electrode Kij confronts a common electrode L formed so as to cover the pixel electrode Kij across the liquid crystal layer, and the voltage is held in the region of the liquid crystal layer enclosed by the pixel electrode and common electrode so that a display is made.

The display control circuit 45 supplies the display data for displaying in the liquid crystal display panel 44 and clock signals for defining the timing to the source driver 42 and gate driver 43. The drive power source circuit 46 supplies the voltage for driving the liquid crystal display panel 44 to the source driver 42, gate driver 43, and common electrode L.

Referring to FIG. 3, the source driver 42 is described in detail. The source driver 42 comprises a two-way shift register 51 and a medium withstand voltage circuit 52. The medium withstand voltage circuit 52 is designed to operate, for example, at a voltage of 14 to 20V. The medium withstand voltage circuit 52 comprises a level shifter 53, analog switches AS1 to ASn (collectively indicated by reference code AS), analog switches AW1 to AWn (collectively indicated by reference code AW), sampling capacitors CS1 to CSn (collectively indicated by reference code CS), hold capacitors CH1 to CHn (collectively indicated by reference code CH), and operational amplifiers Op1 to Opn (collectively indicated by reference code Op).

To the two-way shift register 51 are supplied a start pulse, a shift clock, and a control signal from the display control circuit 45. In the two-way shift register 51, the input start pulse is sequentially shifted according to the shift clock, and outputted. The two-way register 51 operates, for example, at a voltage of 5V. The level shifter 53 transforms the output signal level of the two-way shift register 51, and outputs as a voltage of 14 to 20V.

The analog switch AS is controlled to open or close by the output of the level shifter 53. The video signal supplied from the display control circuit 45 is fed into the sampling capacitor CS through the analog switch AS until the analog switch As is closed, and is held in the sampling capacitor CS after the analog switch As is closed.

The output of the sampling capacitor CS is supplied to the hold capacitor CH through the analog switch AW. The analog switch AW is controlled to open or close by the output enable signal, and while the analog switch AW is open, the output of the sampling capacitor CS is put into the hold capacitor CH, and when the analog switch AW is closed, the voltage at that moment is maintained.

The operational amplifier Op is the operational amplifier circuit 21 shown in the circuit diagram in FIG. 1, and the voltage held in the hold capacitor CH is put into the in-phase input terminal 32. The output terminal 33 is connected to the source electrodes s, and is further connected to the opposite phase input terminal 31 of the operational amplifier circuit 21. As the output is put into the opposite phase input terminal 31, the operational amplifier circuit 21 works as voltage follower.

Figure 4:
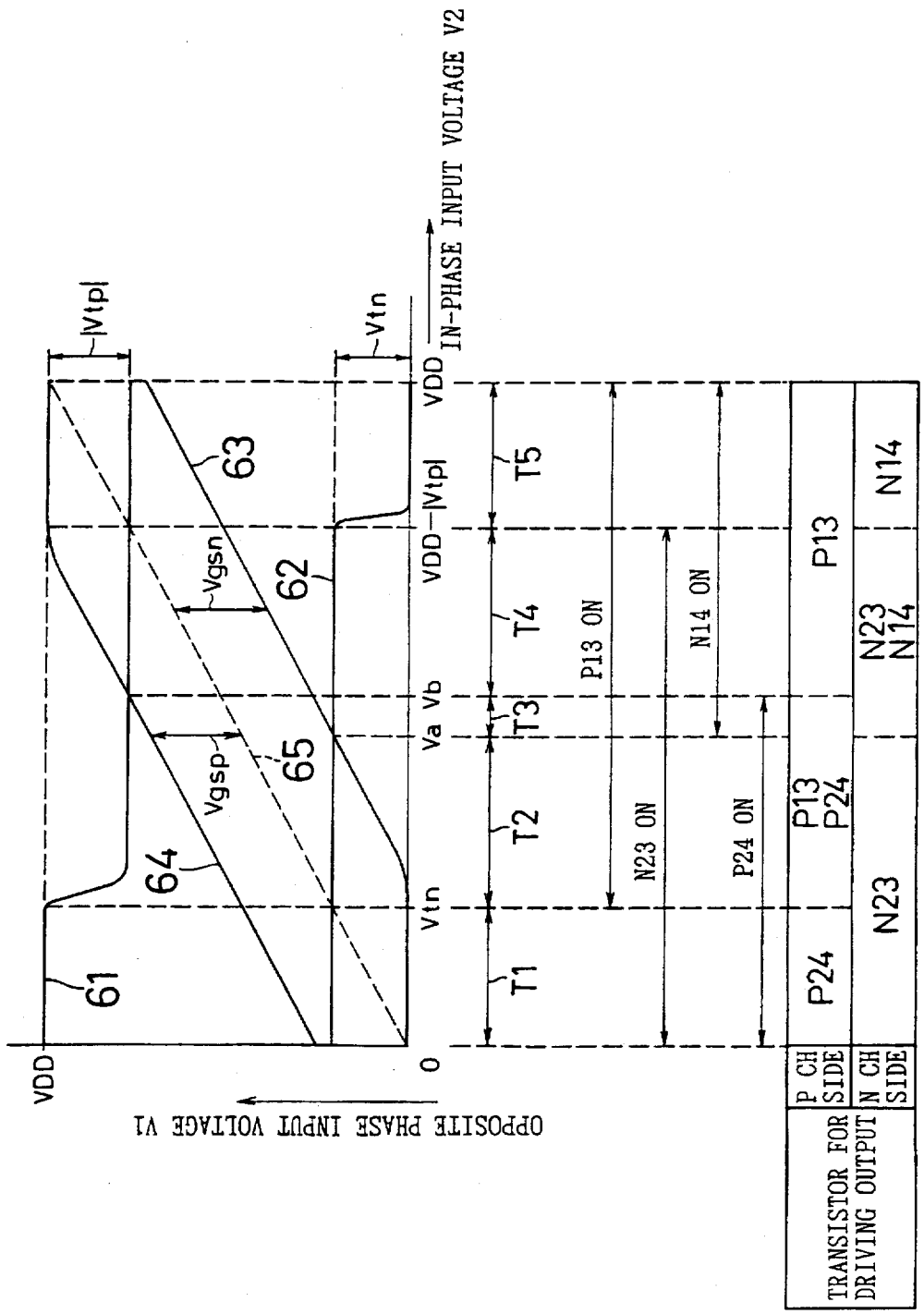
FIG. 4 is a diagram for explaining the operation of the operational amplifier circuit 21.

FIG. 4 is a diagram for explaining the operation of the operational amplifier circuit 21. The axis of abscissas denotes the voltage V2 which is an in-phase input to be fed into the in-phase input terminal 32, and the axis of ordinates represents the voltage V1 which is an opposite phase input to be fed into the opposite phase input terminal 31. In FIG. 4, curve 61 indicates the characteristic of output A of the first differential amplifier circuit 22, and curve 62 shows the characteristic of the output B of the second differential amplifier circuit 23. Curve 63 refers to the characteristic of the output C which is the source potential of the transistors N11, N12, and curve 64 relates to the characteristic of the output D which is the source potential of the transistors P21, P22.

The curve 63 is lowered by a voltage Vgsn by the transistor N13, from the voltages V1, V2 entered from the opposite phase and in-phase input terminals 31, 32 in regions T2 to T5 mentioned below. The voltage Vgsn is the gate-source voltage determined by the action points of the transistors N11, N12.

In FIG. 4, the characteristic of the voltages V1, V2 is represented by line 65. The curve 64 is raised by a voltage Vgsp by the transistor P23 from the voltages V1, V2 in regions T1 to T4 mentioned below. The voltage Vgsp is the gate-source voltage determined by the action points of the transistors P21, P22. In FIG. 4, the voltage VSS is determined to be 0V as the ground voltage.

When both voltages V1 and V2 are voltage values in region T1 from the ground voltage to voltage Vtn, the voltages entered from the input terminals 31, 32 of the operational amplifier circuit 21 are below the threshold voltage Vtn, so that the transistors N11, N12 are cut off. Since the transistors N11, N12 are cut off, the output A is voltage VDD, and the transistor P13 is cut off. The output C is the ground voltage, and hence the transistor N14 is cut off. At this time, the transistors P21, P22 are doing differential amplifying operations, and the transistor N23 is driven by the output B which is the voltage Vtn. The voltage of the output D is sufficiently low, and the transistor P24 conducts. As the transistor P24 conducts, a current flows into the output terminal 33 through the transistor P25. The output level of the output voltage V0 delivered from the output terminal 33 is determined by the conductive state of the transistor N23 and transistors P24 and P25.

When both voltages V1 and V2 are voltage values in region T2 from voltage Vtn to voltage Va, the transistors N23, P24 conduct same as in region T1. The voltage Va is determined to be voltage Vtn+Vgsn. In region T2, since the input voltages V1, V2 are over voltage Vtn, the first differential amplifier circuit 22 conducts. As the first differential amplifier 22 conducts, the output A becomes voltage VDD—|Vtp|, and the transistor P13 conducts. The output level of the output voltage V0 is determined by the conductive state of the transistors N23, P13.

When both voltages V1 and V2 are voltage values in region T3 from voltage Va to voltage Vb, the transistors N23, P24, P13 conduct same as in region T2. The voltage Vb is determined to be voltage VDD—|Vtp|—|Vgsp|. In region T3, since the output voltage C is over voltage Vtn, the transistor N14 conducts. The output level of the output voltage V0 is determined by the conductive state of the transistors N23, P13.

When both voltages V1 and V2 are voltage values in region T4 from voltage Vb to voltage VDD—|Vtp|, the transistors N23, P13, N14 conduct same as in region T3. The output D is over voltage VDD—|Vtp|, and the transistor P24 is cut off. The output level of the output voltage V0 is determined by the conductive state of the transistors N23, P13.

When both voltages V1 and V2 are voltage values in region T5 from voltage VDD—|Vtp| to voltage VDD, the input voltages from the input terminals 31, 32 of the operational amplifier circuit 21 are over voltage VDD—|Vtp|, and therefore the transistors P21, P22 are cut off. Since the transistors P21, P22 are cut off, the output B is lowered to the ground voltage, and the transistor N23 is cut off. Additionally, since the output D becomes voltage VDD, the transistor P24 is cut off. At this time the transistors N11, N12 are doing differential amplifying operations, and the output A is driving the output transistor P13. Besides, the output C is a sufficiently high voltage, and the transistor N14 conducts, and the transistor N15 and output terminal 33 are connected. The output level of the output voltage V0 is determined by the conductive state of the transistor P13 and transistors N14 and N15.

In the regions T2 to T4, meanwhile, when compared with the conventional circuit, as the current passages increase in number, the current consumption increases, but increase of current consumption can be prevented by controlling the bias voltages VB1, VB2 supplied to the transistors N15, P25.

Thus, according to the first embodiment of the invention, if the input voltages V1, V2 are voltage values somewhere between the ground voltage and voltage VDD, there exist always at least one current passage between ground voltage and output terminal 33, and at least one current passage between output terminal 33 and voltage VDD, so that the input dynamic range of the input voltages V1, V2 can be extended. Moreover, the voltage for driving the transistors N14, P24 for switching operation is the voltage to be entered into the transistors N11, N12, and transistors P21, P22, respectively, so that the effects of the invention are achieved while suppressing increase in the number of constituent elements of the circuit. In the conventional operational amplifier circuit, it was required to compose by using depletion type transistors in order to operate between the ground voltage and voltage VDD, but the operational amplifier circuit 21 of the invention can be composed of the enhancement type transistors for operating between the voltages, and therefore the manufacturing process is not increased, and the manufacturing cost is held low.

In the first embodiment of the invention, the transistor N14 working as switching element is provided between the transistor P13 and transistor N15, but, alternatively, the drain of the transistor P13 and the drain of the transistor N15 may be connected, and the transistor N14 may be provided between the source of transistor N15 and voltage VSS. The transistor P24 working as a switching element is provided between the drain of the transistor N23 and the drain of the transistor P25, but, alternatively, by connecting the drain of the transistor N23 and the drain of the transistor P25, the transistor P24 may be provided between the source of transistor P25 and the voltage VDD.

Figure 5:
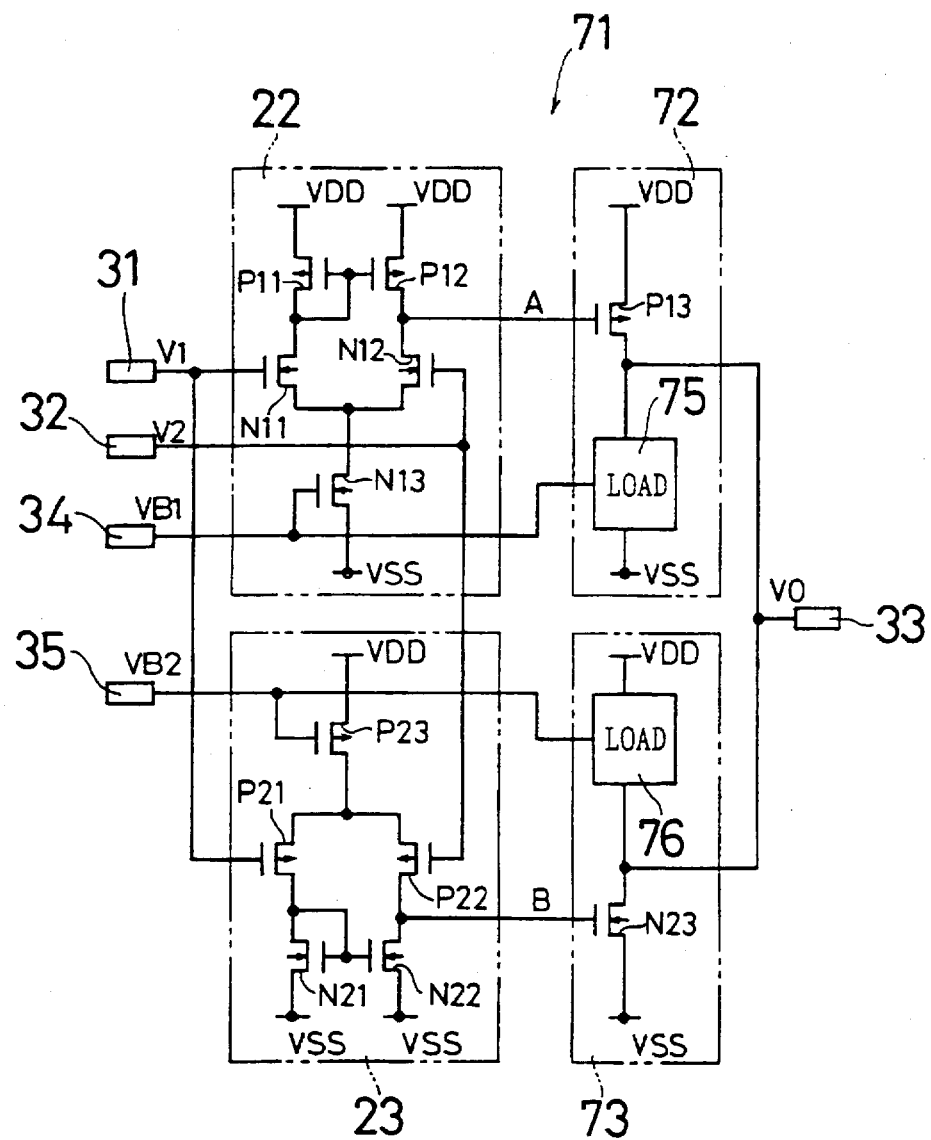
FIG. 5 is a circuit diagram of an operational amplifier circuit 71 of a second embodiment of the invention.
Figure 6:
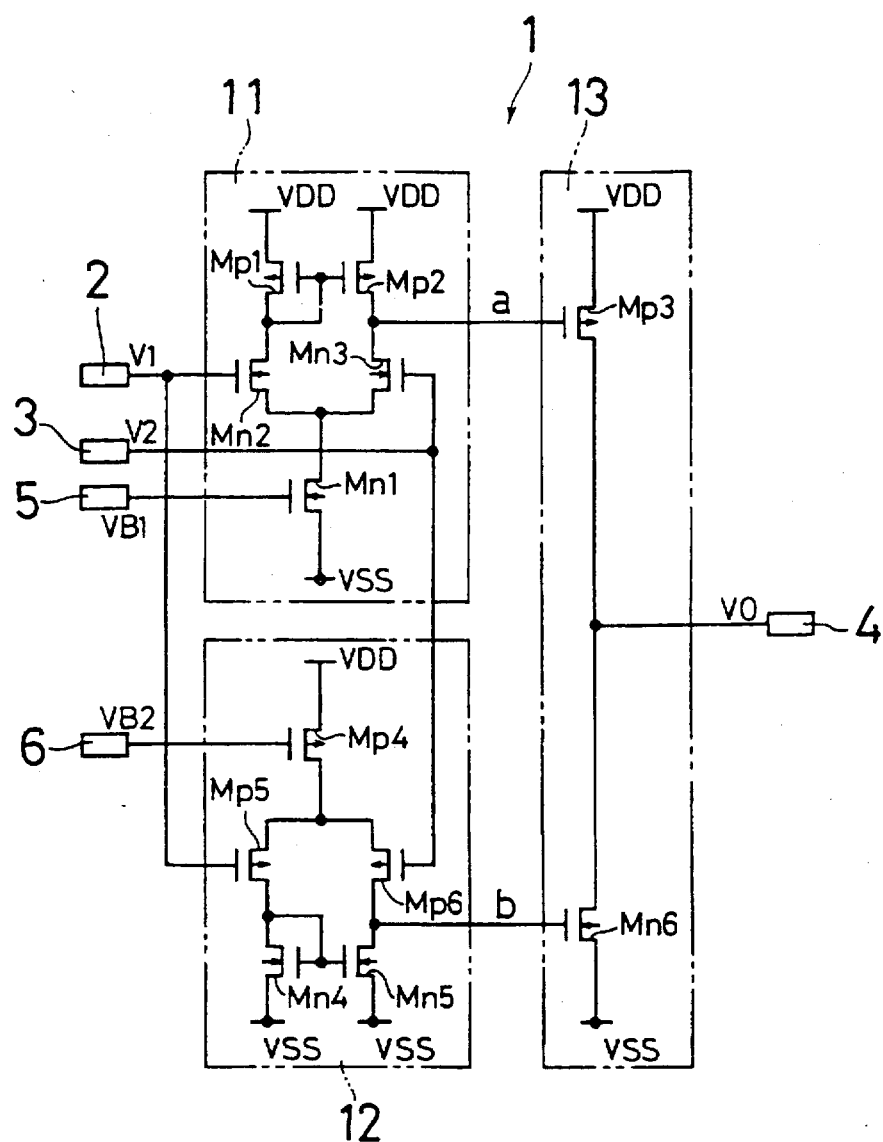
FIG. 6 is a circuit diagram of a CMOS operational amplifier circuit 1 as a typical prior art.
Figure 7:
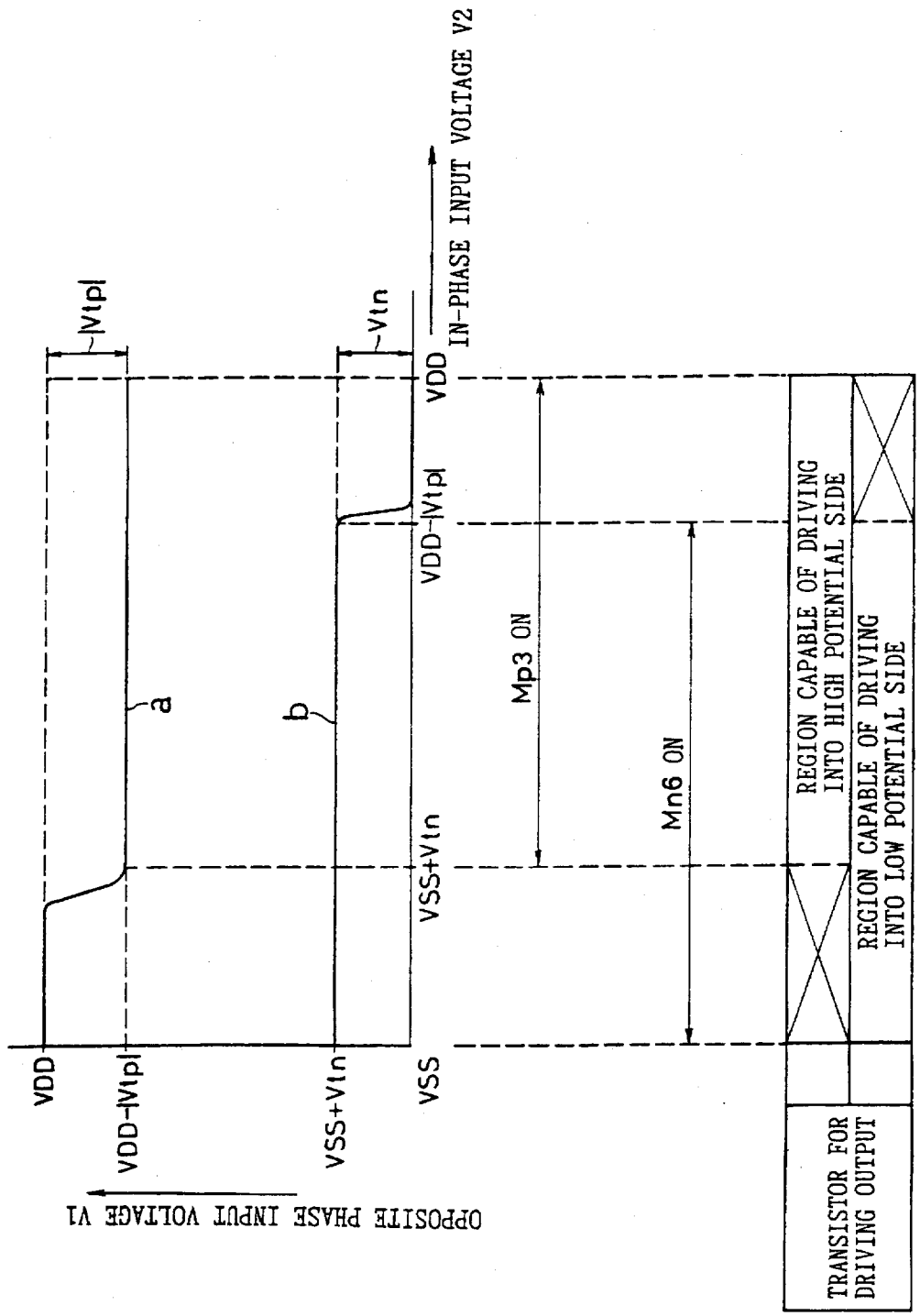
FIG. 7 is a diagram for explaining the operation of the operational amplifier circuit 1.

FIG. 5 is a circuit diagram showing the constitution of an operational amplifier circuit 71 in a second embodiment of the invention. In the operational amplifier 71, same constituent elements as in the operational amplifier circuit 21 are identified with same reference numerals, and explanations are omitted. The operational amplifier circuit 71 is composed by replacing the first output amplifier circuit 24 of the operational amplifier circuit 21 with a first output amplifier circuit 72, and replacing the second output amplifier circuit 25 with a second output amplifier circuit 73.

The first output amplifier circuit 72 comprises transistor P13 and load circuit 75. The load circuit 75, one end of which is connected to the drain of the transistor P13 and the output terminal 33, and to the other end of which is supplied a voltage VSS, acts as a load of a specific resistance value as the bias voltage VB1 is supplied from a first bias input terminal 35.

The second output amplifier circuit 73 comprises transistor N23 and load circuit 76. The load circuit 76, one end of which is connected to the drain of the transistor N23 and the output terminal 33, and to the other end of which is supplied a voltage VDD, acts as a load having a specific resistance value as the bias voltage VB2 is supplied from a second bias input terminal 34.

In the operational amplifier circuit 71, a bias voltage is always supplied to the load circuits 75, 76, and therefore a current passage is provided, and therefore if the other differential amplifier circuit is cut off, the output may be produced.

Thus, according to the second embodiment of the invention, since the current passage is secured by the load circuits 75, 76 to which bias voltages are supplied, the same effects as in the first embodiment may be obtained, while the circuit composition may be further simplified.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An operational amplifier comprising:
    first and second input terminals for receiving respective input signals;
    first differential amplifying means composed of a pair of n-channel type field effect transistors for providing differential amplification, to the gate of one of which the first input terminal is connected, and to the gate of the other of which the second input terminal is connected;
    second differential amplifying means composed of a pair of p-channel type field effect transistors for providing differential amplification, to the gate of one of which the first input terminal is connected, and to the gate of the other of which the second input terminal is connected;
    output amplifying means including a first p-channel type field effect output transistor, to the gate of which is inputted an output of the first differential amplifying means, to the source of which is supplied a predetermined first potential, and to the drain of which is supplied a predetermined second potential through a first load element so as to be lower than the predetermined first potential, and a second n-channel type field effect output transistor, to the gate of which is inputted an output of the second differential amplifying means, to the source of which is supplied the predetermined second potential, to the drain of which is supplied the predetermined first potential through a second load element;
    an output terminal for providing an output signal commonly connected to the drain of the first field effect output transistor and the drain of the second field effect output transistor; and
    wherein the first and second load elements comprise loads having a specific resistance value when the respective differential amplifying means of the first and second differential amplifying means are in a conductive state, and which operate to cut off current flow when the respective differential amplifying means is in a non-conductive state.

2. The operational amplifier of claim 1, wherein the output amplifying means is provided with:
    a first switching element interposed between the first load element and the predetermined second potential, or between the first load element and the first field effect output transistor, so as to be cut off when the first differential amplifying means goes into a non-conductive state, and
    a second switching element interposed between the second load element and the predetermined first potential, or between the second load element and the second field effect output transistor, so as to be cut off when the second differential amplifying means goes into a non-conductive state.

3. The operational amplifier of claim 2, wherein
    control of conduction and cutoff of said first switching element is provided by a source potential of the pair of n-channel field effect transistors in said first differential amplifying means, and
    control of conduction and cutoff of said second switching element is provided by a source potential of the pair of p-channel field effect transistors in the second differential amplifying means.

4. The operational amplifier of claim 2, wherein
    a bias voltage for producing a specific operating point to each of the pair of field effect transistors for providing differential amplification is respectively supplied to the first and second differential amplifying means,
    wherein the first load element comprises a transistor which is made to conduct in response to a bias voltage supplied to the first differential amplifying means, and wherein the second load element comprises a transistor which is made to conduct in response to a bias voltage supplied to the second differential amplifying means.

5. The operational amplifier of claim 4 wherein the first load element comprises an n-channel type field effect transistor and the second load element comprises a p-channel type field effect transistor.

6. The operational amplifier of claim 3 wherein the first switching element comprises an n-channel type field effect transistor and the second switching element comprises a p-channel type field effect transistor.

7. The operational amplifier of claim 2 wherein the first field effect output transistor comprises a p-channel type field effect transistor and the second field effect output transistor comprises an n-channel type field effect transistor.

8. The operational amplifier of claim 7 and wherein the first load element and the first switching element are comprised of n-channel type field effect transistors and the second load element and the second switching element are comprised of p-channel type field effect transistors.

9. The operational amplifier of claim 8 and wherein the n-channel type field effect transistors comprising the first load and switching elements are connected in series with the p-channel type output transistor and the p-channel type transistors comprising the second load and switching elements and are connected in series with the n-channel type output transistor.

10. An operational amplifier comprising:

first and second input terminals for receiving respective input signals;

first differential amplifying means composed of a pair of n-channel type field effect transistors for providing differential amplification, to the gate of one of which the first input terminal is connected, and to the gate of the other of which the second input terminal is connected;

second differential amplifying means composed of a pair of p-channel type field effect transistors for providing differential amplification, to the gate of one of which the first input terminal is connected, and to the gate of the other of which the second input terminal is connected;

output amplifying means including a first p-channel type field effect output transistor, to the gate of which is inputted an output of the first differential amplifying means, to the source of which is supplied a predetermined first potential, and to the drain of which is supplied a predetermined second potential through a first load element so as to be lower than the predetermined first potential, and a second n-channel type field effect output transistor, to the gate of which is inputted an output of the second differential amplifying means, to the source of which is supplied the predetermined second potential, to the drain of which is supplied the predetermined first potential through a second load element;

an output terminal for providing an output signal commonly connected to the drain of the first field effect output transistor and the drain of the second field effect output transistor; and wherein the output amplifying means includes:

a first switching element interposed between the first load element and the predetermined second potential, or between the first load element and the first field effect output transistor so as to be cut off when the first differential amplifying means goes into a non-conductive state, and a second switching element interposed between the second load element and the predetermined first potential, or between the second load element and the second field effect output transistor, so as to be cut off when the second differential amplifying means goes into a non-conductive state.

11. The operational amplifier of claim 10, wherein the first and second load elements comprise loads having a specific resistance value when the respective differential amplifying means of the first and second differential amplifying means are in a conductive state, and which operate to cut off current flow when the respective differential amplifying means is in a non-conductive state.

12. The operational amplifier of claim 10, wherein control of conduction and cutoff of said first switching element is provided by a source potential of the pair of n-channel field effect transistors in said first differential amplifying means, and control of conduction and cutoff of said second switching element is provided by a source potential of the pair of p-channel field effect transistors in the second differential amplifying means.

13. The operational amplifier of claim 10, wherein a bias voltage for producing a specific operating point to each of the pair of field effect transistors for providing differential amplification is respectively supplied to the first and second differential amplifying means, wherein the first load element comprises a transistor which is made to conduct in response to a bias voltage supplied to the first differential amplifying means, and wherein the second load element comprises a transistor which is made to conduct in response to a bias voltage supplied to the second differential amplifying means.

14. The operational amplifier of claim 13 wherein the first load element comprises an n-channel type field effect transistor and the second load element comprises a p-channel type field effect transistor.

15. The operational amplifier of claim 12 wherein the first switching element comprises an n-channel type field effect transistor and the second switching element comprises a p-channel type field effect transistor.

16. The operational amplifier of claim 10 wherein the first field effect output transistor comprises a p-channel type field effect transistor and the second field effect output transistor comprises an n-channel type field effect transistor.

17. The operational amplifier of claim 16 and wherein the first load element and the first switching element are comprised of n-channel type field effect transistors and the second load element and the second switching element are comprised of p-channel type field effect transistors.

18. The operational amplifier of claim 17 and wherein the n-channel type field effect transistors comprising the first load and switching elements are connected in series with the p-channel type output transistor and the p-channel type transistors comprising the second load and switching elements and are connected in series with the n-channel type output transistor.

* * * * *